US012555742B2

(12) United States Patent
Ikeda

(10) Patent No.: US 12,555,742 B2
(45) Date of Patent: Feb. 17, 2026

(54) PLASMA PROCESSING APPARATUS

(71) Applicant: Tokyo Electron Limited, Tokyo (JP)

(72) Inventor: Taro Ikeda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 440 days.

(21) Appl. No.: 18/164,032

(22) Filed: Feb. 3, 2023

(65) Prior Publication Data

US 2023/0260750 A1 Aug. 17, 2023

(30) Foreign Application Priority Data

Feb. 15, 2022 (JP) ................................ 2022-021560

(51) Int. Cl.
*H01J 37/32* (2006.01)

(52) U.S. Cl.
CPC .... *H01J 37/32082* (2013.01); *H01J 37/3244* (2013.01); *H01J 37/32715* (2013.01); *H01J 37/32834* (2013.01)

(58) Field of Classification Search
CPC .......... H01J 37/32633; H01J 37/32834; H01J 37/32449
See application file for complete search history.

(56) References Cited

U.S. PATENT DOCUMENTS

2021/0156024 A1* 5/2021 Roh .................... C23C 16/4412

FOREIGN PATENT DOCUMENTS

JP 2020-147795 A 9/2020

* cited by examiner

*Primary Examiner* — Joseph A Miller, Jr.
(74) *Attorney, Agent, or Firm* — Armstrong Teasdale LLP

(57) ABSTRACT

A plasma processing apparatus includes: a processing container; a stage in the processing container; an upper electrode provided to face a placement surface of the stage; and an exhaust duct provide to define a processing space inside the processing container together with the placement surface and the upper electrode, wherein a radial cross-section of an outer wall of the exhaust duct facing the processing space is an L-shape, the exhaust duct includes an exhaust hole communicating with an internal exhaust path, and the exhaust hole is configured such that, with respect to first and second lengths of two sides of the L-shape, a distance from a corner portion of the L-shape to the exhaust hole is equal to or less than each of the first and second lengths, the first length is 7 mm or more, and the second length is equal to or greater than the first length.

10 Claims, 4 Drawing Sheets

PLASMA PROCESSING APPARATUS

CROSS-REFERENCE TO RELATED APPLICATION

This application is based upon and claims the benefit of priority from Japanese Patent Application No. 2022-021560, filed on Feb. 15, 2022, the entire contents of which are incorporated herein by reference.

TECHNICAL FIELD

The present disclosure relates to a plasma processing apparatus.

BACKGROUND

A technique for preventing abnormal discharge in a plasma processing apparatus that applies radio frequency power has been proposed. For example, Patent Document 1 discloses a plasma processing apparatus including a processing container, a stage on which a substrate is placed inside the processing container and including a heater provided therein, and an annular member formed of a dielectric and provided to be spaced apart from the stage, wherein an annular groove is radially formed on the lower surface of the annular member. According to this, an electric field generated by radio frequency power passing through the annular member is distributed by forming the groove on the lower surface of the annular member provided to be spaced apart from the stage. Thus, the electric field intensity is lowered in a gap between the stage and the annular member, which prevents abnormal discharge.

PRIOR ART DOCUMENTS

Patent Documents

Patent Document: Japanese Patent Laid-Open Publication No. 2020-147795

SUMMARY

According to an aspect of the present disclosure, a plasma processing apparatus includes: a processing container; a stage provided inside the processing container; an upper electrode provided to face a placement surface of the stage and constituting a ceiling wall of the processing container, radio-frequency power being supplied to the upper electrode; and an exhaust duct provide to define a processing space inside the processing container together with the placement surface and the upper electrode, wherein a radial cross-section of an outer wall of the exhaust duct facing the processing space is an L-shape, wherein the exhaust duct includes an exhaust hole communicating with an internal exhaust path, and the exhaust hole is configured such that, with respect to a first length and a second length of two sides of the L-shape, a distance from a corner portion of the L-shape to the exhaust hole is equal to and less than the first length and is equal to and less than the second length, and the length is 7 mm or more, and the second length is equal to or greater than the first length.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
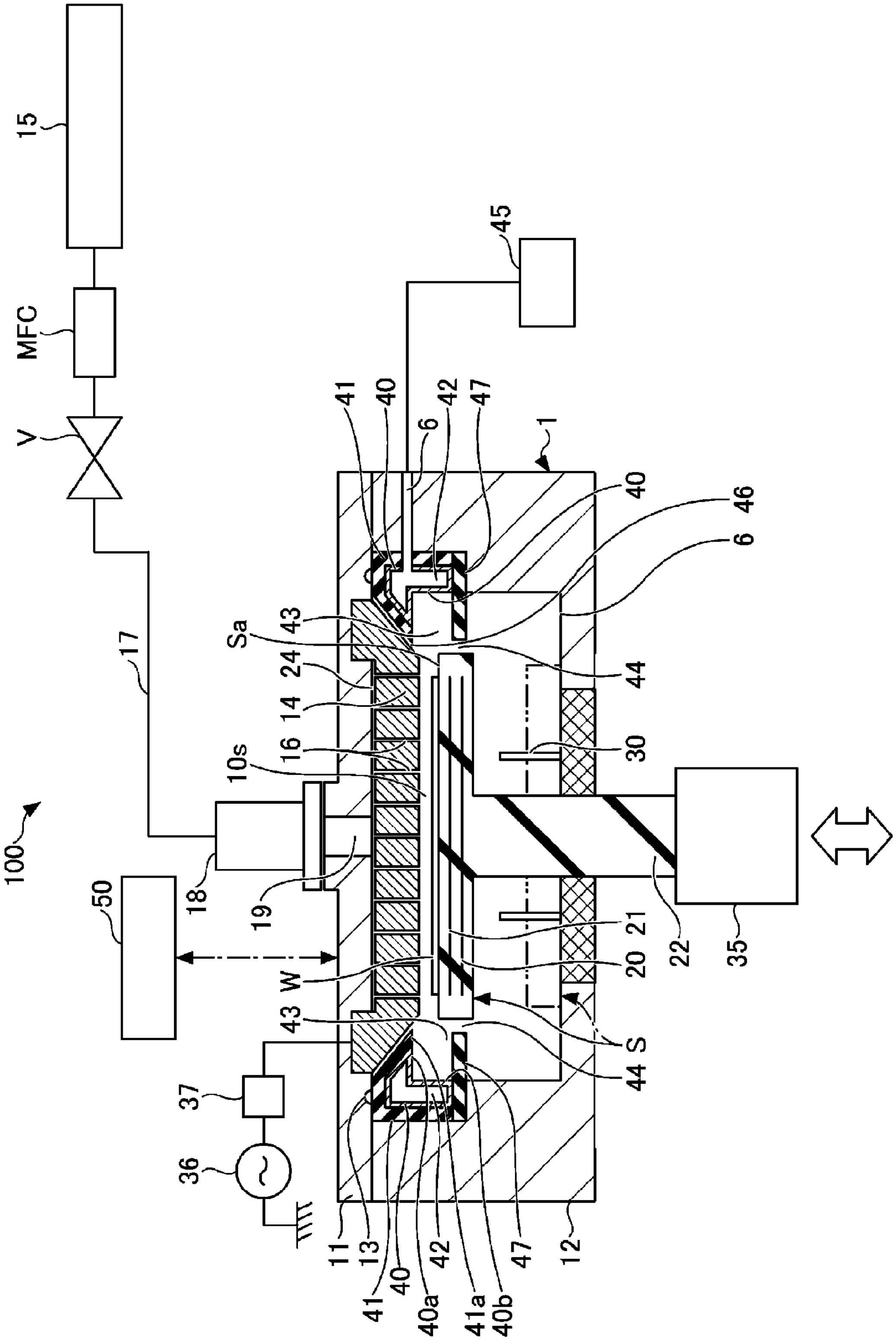
FIG. 1 is a schematic cross-sectional view illustrating an example of a plasma processing apparatus according to an embodiment.

Hereinafter, embodiments for carrying out the present disclosure will be described with reference to the drawings. In each drawing, the same reference numerals will be given to the same components, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In this specification, a deviation to the extent of not impairing the effects of embodiments is allowed in orientations such as parallel, right angle, orthogonal, horizontal, vertical, up-and-down, left-and-right, and the like. The shape of a corner portion is not limited to a right angle, but may be rounded in an arc shape. Parallel, right angle, orthogonal, horizontal, vertical, circular, and coincident may include approximately parallel, approximately right angle, approximately orthogonal, approximately horizontal, approximately vertical, approximately circular, and approximately coincident.

[Plasma Processing Apparatus]

A plasma processing apparatus 100 according to an embodiment will be described with reference to FIG. 1. FIG. 1 is a schematic cross-sectional view illustrating an example of the plasma processing apparatus 100 according to an embodiment. The plasma processing apparatus 100 includes a processing container 1. The processing container 1 includes a container 12 and a cover 11, and the cover 11 is provided at an upper opening of the container 12 with a bottom. The container 12 and the cover 11 are formed of, for example, aluminum. Inner walls of the container 12 and the cover 11 may be coated with a film of ceramics such as an aluminum oxide or yttrium oxide having plasma corrosion resistance.

A stage S is provided inside the container 12. The stage S is formed in a flat disk shape and has an upper surface serving as a placement surface Sa on which a substrate W, for example, a wafer, is placed. The stage S is formed of, for example, a dielectric such as alumina ($Al_2O_3$). A heater 20 is embedded in the stage S to heat the substrate W. The heater 20 is constituted with, for example, a sheet-shaped or plate-shaped resistive heating element, and generates heat upon receiving power supplied from a power supply to heat the placement surface Sa of the stage S, thereby raising a temperature of the substrate W to a predetermined process temperature suitable for film formation. For example, the heater 20 heats the substrate W placed on the stage S to a temperature of 100 degrees C. to 300 degrees C.

Further, a mesh-shaped metal electrode plate 21 is embedded in the stage S in parallel to the heater 20. The electrode plate 21 may be supplied with radio frequency (RF) bias power, or may be connected to a ground. The stage S functions as a lower electrode facing an upper electrode 14.

The stage S is supported by a support 22 extending downward from the stage S. The support 22 penetrates the bottom of the container 12 and is supported by a lifting mechanism 35. The lifting mechanism 35 moves the support 22 up and down, whereby the stage S is moved up and down between a processing position where a processing of the substrate W is performed (the position of the stage S illustrated in FIG. 1) and a transfer position where transfer of the substrate W is performed (the position of the stage S indicated by the two-dot dashed line of FIG. 1). Further, a distance (gap) between the stage S and the upper electrode 14 is adjusted by the lifting mechanism 35.

At the transfer position, the substrate W is transferred to and from an external transfer mechanism through a loading/unloading port (not illustrated). The stage S is formed with a through-hole through which a shaft portion of a lifting pin 30 is inserted. In a state where the stage S is moved from the processing position of the substrate W (see FIG. 1) to the transfer position of the substrate W (see the two-dot dashed line of FIG. 1), a head portion of the lifting pin 30 protrudes from the placement surface of the stage S. Thus, the head portion of the lifting pin 30 supports the substrate W from the lower surface of the substrate W and lifts the substrate W from the placement surface Sa of the stage S to transfer the substrate W to and from the external transfer mechanism.

The upper electrode 14, which functions as a shower head, is supported by the cover 11 at a position above the stage S and below the cover 11 while being insulated from the cover 11. The upper electrode 14 is formed of a conductor such as aluminum and has a disk shape. The upper electrode 14 is provided to face the stage S and constitutes a ceiling wall of the processing container 1, and RF power is supplied to the upper electrode 14. A large number of gas supply holes 16 is provided in the upper electrode 14. The supply and cutoff of and a flow rate of a film forming gas output from a gas supplier 15 are controlled by a valve V and a mass flow controller MFC, and the gas, the flow rate of which is controlled, is introduced to a gas inlet 18 through a gas line 17. The introduced gas passes through a through-hole 19 formed in the cover 11 and is introduced into the container 12 from the large number of gas supply holes 16 through a flow path 24.

An RF power supply 36 is connected to the upper electrode 14 via a matcher 37. RF power having a frequency of, for example, 13.56 MHz in the frequency range of 0.4 MHz to 2,450 MHz is supplied from the RF power supply 36 to the upper electrode 14. The film forming gas introduced into the container 12 is dissociated by an RF electric field, and plasma is generated. A film forming processing is performed on the substrate W placed on the stage S by the plasma generated in a space (hereinafter also referred to as "processing space 10*s*") between the upper electrode 14 and the stage S. The film forming processing is an example of a plasma processing, and the plasma processing may be an etching processing or the like.

A separation plate 47, which extends inward from the sidewall of the container 12, is provided around the stage S so as to be spaced apart from the stage S by a gap 44. The separation plate 47 is formed of an insulating material such as alumina ($Al_2O_3$). The separation plate 47 is an annular member and separates the internal space of the processing container 1 into an upper space and a lower space together with the stage S. The outer peripheral side of the separation plate 47 is disposed on a stepped portion provided on the side surface of the container 12. The inner peripheral side of the separation plate 47 protrudes radially from the side surface of the container 12 toward the stage S. An insulating member 41 extends upward from the outer peripheral end of the separation plate 47 and covers the sidewall of the container 12, the cover 11, and the outer periphery of the upper electrode 14 at a position higher than the stage S so as to surround an exhaust duct 40. With this configuration, the insulating member 41 and the separation plate 47 form an opening 43 that is open toward the processing space 10*s* in the circumferential direction over the entire circumference. In addition, the exhaust duct 40 and the cover 11 are sealed by an O-ring 13. Thus, the interior of the processing container 1 may be sealed and kept in a vacuum state.

The insulating member 41 is formed of ceramics such as alumina ($Al_2O_3$). The exhaust duct 40 is provided inside the insulating member 41 in close contact with the inner wall of the insulating member 41. The exhaust duct 40 is formed of a metal such as aluminum and is connected to a ground. The exhaust duct 40 is an annular member formed in the circumferential direction over the entire circumference and is internally formed with an exhaust path 42 in the circumferential direction.

The exhaust duct 40 is almost covered with the insulating member except for outer walls 40*a* and 40*b* facing the processing space 10*s*. The exhaust duct 40 is shaped such that a portion of the horizontal outer wall 40*a* and of the vertical outer wall 40*b* facing the opening 43 is recessed outward. The placement surface Sa of the stage S, the upper electrode 14, and the outer walls 40*a* and 40*b* of the exhaust duct 40 define the processing space 10*s* in the processing container 1.

With this configuration, the insulating member 41 is provided between the upper electrode 14 and the exhaust duct 40, and the upper electrode 14 and the exhaust duct 40 are insulated by the insulating member 41. A gap 46 is formed between the insulating member 41 and the upper electrode 14 (see FIG. 2C). Since the upper electrode 14 is formed of a metal and the insulating member 41 is formed of ceramics, the gap 46 is provided in order to reduce friction or interference between the members on both sides due to the difference in thermal expansion.

An interface portion defined by an outer wall 41*a* of the insulating member 41 facing the processing space 10*s* and the outer wall 40*a* of the exhaust duct 40 is formed as a non-stepped flat surface, and the exhaust duct 40 extends downward by changing its direction by an angle of 90 degrees at an intersection portion (corner portion) of the outer wall 40*a* with the outer wall 40*b*.

When referring to a portion of the exhaust duct 40 corresponding to the height of the outer wall 40*b* as a lower portion and to a portion of the exhaust duct 40 above the outer wall 40*b* as an upper portion, a radial width of the lower portion of the exhaust duct 40 is smaller than a radial width of the upper portion of the exhaust duct 40. The exhaust duct 40 may be shaped such that the radial width of the lower portion is greater than the radial width of the upper portion.

Figure 3A:
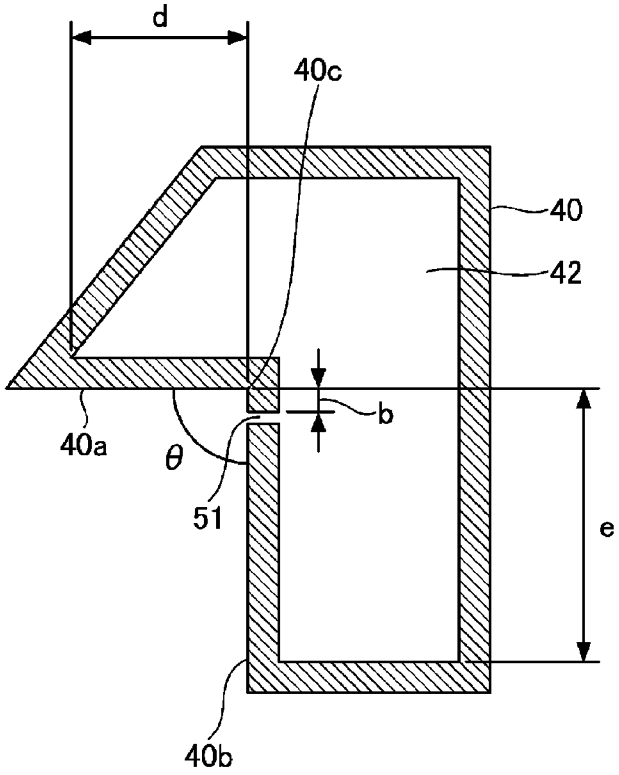
FIGS. 3A and 3B are diagrams illustrating an example of the exhaust duct according to an embodiment.
Figure 3B:
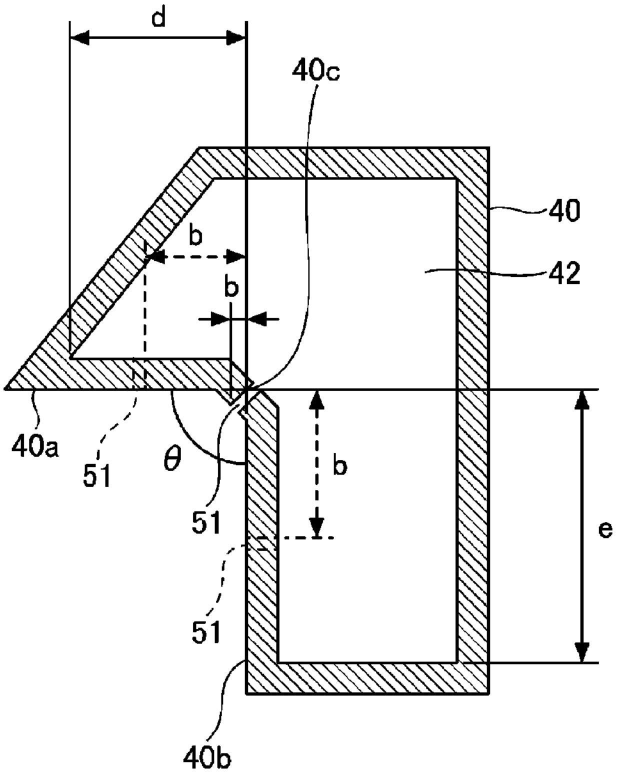

An exhaust hole 51 is formed in the exhaust duct 40 to pass through a predetermined position of the outer walls 40*a* and 40*b* (see FIGS. 3A and 3B). A plurality of exhaust holes 51 is equidistantly provided in the circumferential direction. A gas that has passed through the exhaust path 42 is discharged out of the processing container 1 by a vacuum pump 45 from an exhaust port 6 provided laterally from the exhaust duct 40.

The plasma processing apparatus 100 includes a controller 50. The controller 50 may be a computer provided with a processor, a storage such as a memory, an input device, a display device, a signal input/output interface, and the like. The controller 50 controls each part of the plasma processing apparatus 100. The controller 50 may allow an operator to perform a command input operation and the like using the input device in order to manage the plasma processing apparatus 100. Further, the controller 50 may cause the display device to visually display the operation status of the plasma processing apparatus 100. Furthermore, the storage stores a control program and recipe data. The control program is executed by the processor in order to execute various processes in the plasma processing apparatus 100. The processor executes the control program to control each part of the plasma processing apparatus 100 according to the recipe data.

[Abnormal Discharge and Countermeasure]

Figures 2A, 2B, 2C:
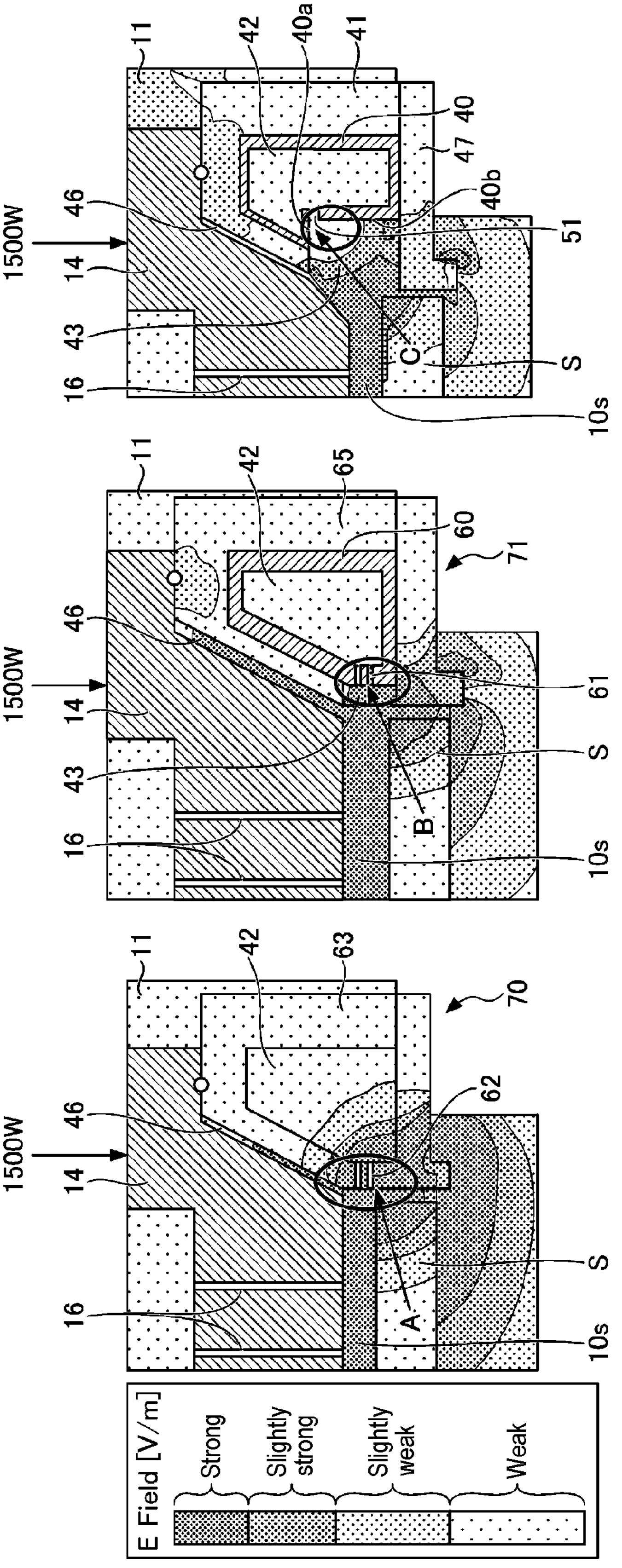
FIGS. 2A to 2C are diagrams illustrating an example of simulation results of an electric field around an exhaust duct according to an embodiment in comparison with reference examples.

Next, abnormal discharge and a countermeasure thereof will be described with reference to FIGS. 2A to 2C. FIG. 2C illustrates an example of simulation results of an electric field around the exhaust duct 40 according to the embodiment in comparison with reference examples of FIGS. 2A and 2B. FIG. 2A illustrates an example of simulation results of an electric field around an exhaust mechanism 70 according to Reference Example 1. FIG. 2B illustrates an example of simulation results of an electric field around an exhaust mechanism 71 according to Reference Example 2.

The RF power output from the RF power supply 36 illustrated in FIG. 1 is supplied to the upper electrode 14. Thus, an RF current flows between the upper electrode 14 and the stage S functioning as the lower electrode, thus generating a strong electric field in the processing space 10*s*.

Along with this, the RF power output from the RF power supply 36 flows over the surfaces of the metal cover 11 and the container 12 outside the upper electrode 14 and propagates through the insulating member. In FIGS. 2A to 2C, RF power of 1,500 W is supplied to flow over the surface of the cover 11 and propagate through an insulating member 63 (FIG. 2A), an insulating member 65 (FIG. 2B), and the insulating member 41 (FIG. 2C). Thus, an electric field is generated in the insulating members 63, 65, and 41 formed of ceramics. When the electric field becomes stronger to some extent, a risk of occurrence of an abnormal discharge may increase.

The abnormal discharge does not occur in the exhaust mechanisms 70 and 71 and the exhaust duct 40 under the condition where RF power is as low as 200 W to 300 W. However, in recent years, the number of processes that supply high RF power of 1,000 W or more has been increasing. When such high RF power is supplied, a strong electric field is generated around the exhaust mechanisms 70 and 71, which may cause the occurrence of abnormal discharge.

Simulations illustrated in FIGS. 2A to 2C show the results of performing the simulations under the condition that RF power of 1,500 W with a frequency of 13.56 MHz is supplied to the upper electrode 14. In the exhaust mechanism 70 of Reference Example 1 illustrated in FIG. 2A, the exhaust path 42 is formed in the annular insulating member 63 formed of ceramics. Further, an exhaust hole 62 is formed in the outer wall of the insulating member 63 facing the processing space 10*s*. The exhaust mechanism 70 does not have the metal exhaust duct 40.

The RF power flows over the surface of the metal cover 11 outside the upper electrode 14 and propagates through the insulating member 63. Thus, an electric field is generated in the alumina insulating member 63 and in the exhaust path 42. The electric field becomes stronger in a region A where the exhaust hole 62 is formed in the vicinity of the opening 43. Abnormal discharge is likely to occur in the region A where the electric field is strong.

In the configuration of the exhaust mechanism 70 of Reference Example 1 illustrated in FIG. 2A, the gas supplied from the gas supply hole 16 of the upper electrode 14 is plasmarized in the processing space 10*s*, such that the gas flows from the processing space 10*s* to the outer peripheral side, is introduced into the insulating member 63 from the exhaust hole 62, and is discharged through the exhaust path 42. At this time, abnormal discharge may occur in the region A where the electric field is concentrated. Further, abnormal discharge may occur in a portion where the electric field is strong even in the vicinity of the region A in the insulating member 63. In particular, if the plasma generated in the processing space 10*s* is introduced to the exhaust hole 62 and the strong electric field is generated in the vicinity of the exhaust hole 62 as illustrated in the region A, abnormal discharge will occur in the exhaust hole 62. Therefore, it is necessary to weaken the electric field in the region A in the vicinity of the exhaust hole 62.

The exhaust mechanism 71 of Reference Example 2 illustrated in FIG. 2B is constituted with the alumina insulating member 65 and an aluminum exhaust duct 60. The insulating member 65 includes the opening 43 that is open toward the processing space 10*s* in the circumferential direction over the entire circumference. The exhaust duct 60 is provided so as to cover the inner wall of the insulating member 65. An exhaust hole 61 is formed in the exhaust duct 60 toward the opening 43.

In this configuration, the gas supplied from the gas supply hole 16 of the upper electrode 14 is plasmarized in the processing space 10*s*, such that the gas flows from the processing space 10*s* to the outer peripheral side, is introduced into the exhaust duct 60 from the exhaust hole 61, and is discharged through the exhaust path 42. At this time, abnormal discharge may occur in a region B where the electric field is concentrated. In addition, since the exhaust duct 60 is connected to a ground, the electric field in the exhaust duct 60 is zero. Thus, no abnormal discharge occurs in the exhaust duct 60. On the other hand, if the plasma generated in the processing space 10*s* is introduced to the exhaust hole 61 and a strong electric field is generated in the vicinity of the exhaust hole 61 as illustrated in the region B, abnormal discharge will occur in the exhaust hole 61. Therefore, it is necessary to weaken the electric field in the region B in the vicinity of the exhaust hole 61.

Accordingly, the exhaust duct 40 of the embodiment illustrated in FIG. 2C is configured such that a portion thereof facing the opening 43 is recessed with respect to the exhaust duct 60 of FIG. 2B. That is, the exhaust duct 40 is covered with the insulating member 41 and the separation plate 47 except for the outer walls 40*a* and 40*b*, and the outer walls 40*a* and 40*b* facing the processing space 10*s* are recessed in an L-shape. The exhaust hole 51 is formed at the corner portion (or in the vicinity of the corner portion) of the recessed outer walls 40*a* and 40*b*.

In this configuration, the gas supplied from the gas supply hole 16 of the upper electrode 14 is plasmarized in the processing space 10*s*, such that the gas flows from the processing space 10*s* to the outer peripheral side, is introduced into the exhaust duct 40 from the exhaust hole 51, and is discharged through the exhaust path 42 from the lateral side of the container 12. In addition, the exhaust duct 40 is connected to a ground. At this time, due to the shape of the recessed outer walls 40*a* and 40*b*, the recessed outer walls 40*a* and 40*b* form a region simply surrounded by the ground potential on the processing space 10*s* side, thereby being capable of preventing the introduction of the plasma to the exhaust hole 51. This weakens the electric field in the vicinity of the outer walls 40*a* and 40*b*. Thus, since the electric field is weak in a region C in the vicinity of the exhaust hole 51 provided at the corner portion of the outer walls 40*a* and 40*b*, the abnormal discharge may be prevented from being generated in the exhaust hole 51. Further, since the exhaust duct 40 is connected to a ground, the electric field in the exhaust duct 40 is zero. Thus, no abnormal discharge occurs in the exhaust duct 40. In particular, if the plasma generated in the processing space 10*s* is introduced to the exhaust hole 51 and the strong electric field is generated in the vicinity of the exhaust hole 51, abnormal discharge will occur in the exhaust hole 51. However, in the configuration of the exhaust duct 40 according to the present embodiment, the position of the exhaust hole 51 may be kept away from the plasma in the processing space 10*s*. Further, the electric field may be weakened in the region C in the vicinity of the exhaust hole 51. Thus, the gas may be discharged from the lateral side of the processing container 1 while avoiding or preventing abnormal discharge around the exhaust hole 51 and the exhaust duct 40. As a result, it is possible to increase the performance of the plasma and the process while avoiding or preventing abnormal discharge and to reduce the size of the processing container 1, as compared with a case where the exhaust duct is arranged at the bottom of the processing container 1.

[Exhaust Duct]

Figure 4B:
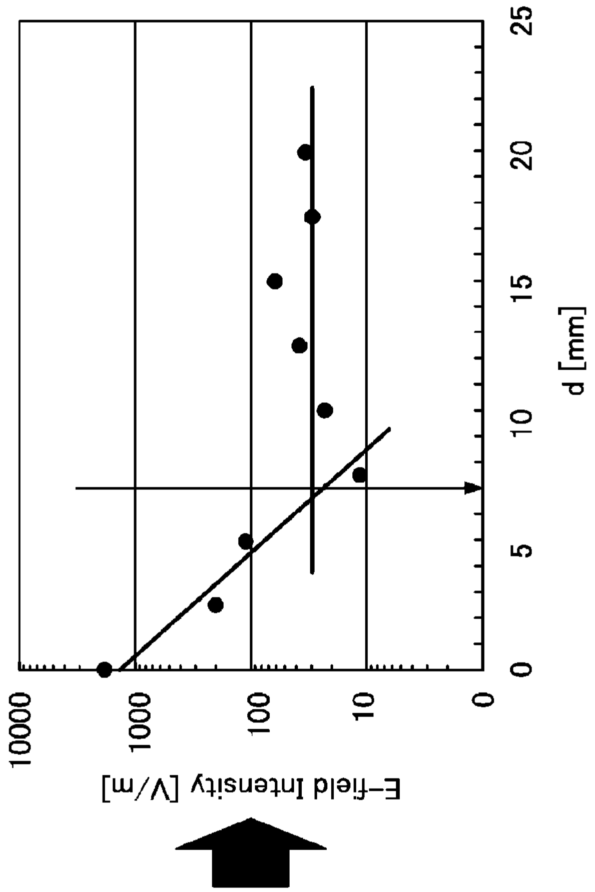
FIGS. 4A and 4B are diagrams illustrating an example of simulation results showing a relationship between a length of an outer wall of the exhaust duct according to an embodiment and an electric field intensity.
Figure 4A:
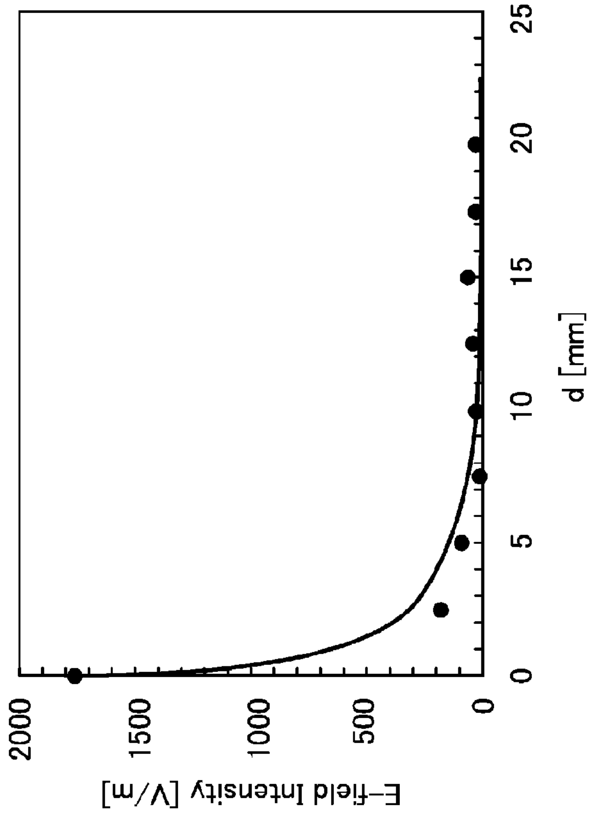

The configuration of the exhaust duct 40 will be described in detail with reference to FIGS. 3A to 4B. FIGS. 3A and 3B are diagrams illustrating an example of the exhaust duct 40 according to an embodiment. FIGS. 4A and 4B are diagrams illustrating an example of simulation results showing a relationship between the electric field intensity and a length of the outer wall of the exhaust duct 40 according to an embodiment.

Referring to the radial cross-section of the exhaust duct 40 of FIGS. 1 and 3A, the outer walls 40*a* and 40*b* facing the processing space 10*s* form an L-shape and have a corner portion 40*c* formed by two sides of the outer walls 40*a* and 40*b*. The outer wall 40*a* is a horizontal surface and the outer wall 40*b* is a vertical surface.

An angle θ (the angle of the corner portion 40*c*) is 90 degrees or less. For example, the angle θ is 45 degrees. The angle θ may be 30 degrees or more and 90 degrees or less. The reason that the angle θ is 30 degrees or more and 90 degrees or less is to prevent the exhaust hole 51 from being sealed by a reaction product generated during film formation and to increase the efficiency when removing the reaction product by cleaning to thereby prevent generation of particles.

The exhaust duct 40 includes the exhaust hole 51 through which the gas flowing from the processing space 10*s* is discharged. The exhaust hole 51 is configured such that, with respect to lengths d and e of two sides of the outer walls 40*a* and 40*b* forming an L-shape, a distance b from the L-shaped corner portion 40*c* to the inner wall of the exhaust hole 51 is equal to or less than the length d and is also equal to or less than the length e.

The length d is 7 mm or more, and the length e is equal to or greater than the length d. The reason that the length d is 7 mm or more will be described with reference to FIGS. 4A and 4B. FIG. 4A illustrates an example of simulation results showing a relationship between the electric field intensity and the length d of the outer wall 40*a* of the exhaust duct 40 according to the embodiment under the condition where RF power of 1,500 W with a frequency of 13.56 MHz is supplied to the upper electrode 14. FIG. 4B illustrates the vertical axis of FIG. 4A in logarithm.

In FIGS. 4A and 4B, the horizontal axis is the length d of the outer wall 40*a* and the vertical axis is the electric field intensity in the vicinity of the outer wall 40*a* and the outer wall 40*b* on the processing space 10*s* side. When the electric field intensity is 30 V/m or less, abnormal discharge hardly occurs in a portion of the exhaust hole 51. When obtaining the length d of the outer wall 40*a* capable of realizing the electric field intensity of 30 V/m or less from the simulation result of the electric field of FIG. 4B, the length d becomes 7 mm or more.

From the above, the exhaust duct 40 according to the present embodiment is configured such that the distance b from the L-shaped corner portion 40*c* to the exhaust hole 51 is equal to or less than the length d (d≥7 mm) and is also equal to or less than the length e. Thus, the electric field may be set to approximately zero in the exhaust hole 51, so that the occurrence of abnormal discharge around the exhaust hole 51 and the exhaust duct 40 may be avoided.

As illustrated in FIG. 3B, the outer walls 40*a* and 40*b* may be slanted at the corner portion 40*c*, such that the corner portion 40*c* may be formed as a chamfered portion. Such a shape is also included in the shape in which the radial cross-section of the outer walls 40*a* and 40*b* facing the processing space 10*s* of the exhaust duct 40 is an L-shape. The exhaust hole 51 penetrates through at least one of the outer walls 40*a* and 40*b* including the chamfered portion. Even in this case, with respect to the length d of the outer wall 40*a* and the length e of the outer wall 40*b* illustrated in FIG. 3B, the distance b from the L-shaped corner portion 40*c* to the exhaust hole 51 illustrated in FIG. 3B is equal to or less than the length d (d≥7 mm) and is equal to or less than the length e. In addition, even if the angle θ of the corner portion 40*c* is not limited to 90 degrees but is 90 degrees or less (e.g., 45 degrees), such a shape is included in the above shape in which the radial cross-section of the outer walls 40*a* and 40*b* facing the processing space 10*s* of the exhaust duct 40 is an L-shape.

The diameter of the exhaust hole 51 may be 1 mm to 3 mm. This is because abnormal discharge easily occurs when the diameter of the exhaust hole 51 is greater than 3 mm and because the reaction product used in a film forming processing performed in the processing space 10*s* causes the exhaust hole 51 to be blocked when the diameter of the exhaust hole 51 is smaller than 1 mm.

As described above, according to the plasma processing apparatus of the present embodiment, occurrence of abnormal discharge in the mechanism for exhausting the processing space from the lateral side may be avoided or prevented.

The plasma processing apparatus according to the embodiment disclosed herein should be considered to be exemplary and not limitative in all respects. The embodiment may be modified and improved in various forms without departing from the scope of the appended claims and their gist. The matters described in the aforementioned embodiments may have other configurations to the extent that they are not contradictory, and may be combined to the extent that they are not contradictory.

In addition, in the above embodiment, the exhaust duct 40 is shaped such that the outer wall 40*a* protrudes inward above the outer wall 40*a*, but is not limited thereto. For example, the exhaust duct 40 may be shaped to protrude inward below the outer wall 40*b*.

According to one aspect, it is possible to avoid or prevent occurrence of abnormal discharge in a mechanism for exhausting a processing space from a lateral side of the processing space.

What is claimed is:

1. A plasma processing apparatus comprising:

a processing container;

a stage provided inside the processing container;

an upper electrode provided to face a placement surface of the stage and constituting a ceiling wall of the processing container, radio-frequency power being supplied to the upper electrode; and an exhaust duct provided to define a processing space inside the processing container together with the placement surface and the upper electrode, the exhaust duct being connected to a ground, wherein a radial cross-section of an outer wall of the exhaust duct facing the processing space is an L-shape including a horizontal side and a vertical side, wherein the exhaust duct includes an exhaust hole communicating with an internal exhaust path, and the exhaust hole is configured such that, with respect to a first length of the horizontal side and a second length of the vertical side of the L-shape, a distance from a corner portion of the L-shape to the exhaust hole is equal to or less than the first length and is equal to or less than the second length, and wherein the first length is 7 mm or more, and the second length is equal to or greater than the first length, and wherein the exhaust hole is formed in the vertical side or the corner portion.

2. The plasma processing apparatus of claim 1, wherein an insulating member is provided between the upper electrode and the exhaust duct, and wherein the insulating member insulates the upper electrode from the exhaust duct.

3. The plasma processing apparatus of claim 2, wherein a surface defined by an outer wall of the insulating member facing the processing space and the outer wall of the exhaust duct is a flat surface, and the corner portion is a chamfered portion formed by chamfering the corner portion with respect to the flat surface.

4. The plasma processing apparatus of claim 3, wherein no gap is formed between the exhaust duct and the insulating member, and wherein a gap is formed between the upper electrode and the insulating member.

5. The plasma processing apparatus of claim 4, wherein the corner portion formed by the two sides is formed at an angle of 90 degrees or less.

6. The plasma processing apparatus of claim 5, wherein the angle of the corner portion is 30 degrees or more and 90 degrees or less.

7. The plasma processing apparatus of claim 6, wherein the exhaust hole has a diameter of 1 mm to 3 mm.

8. The plasma processing apparatus of claim 2, wherein no gap is formed between the exhaust duct and the insulating member, and wherein a gap is formed between the upper electrode and the insulating member.

9. The plasma processing apparatus of claim 1, wherein the corner portion formed by the two sides is formed at an angle of 90 degrees or less.

10. The plasma processing apparatus of claim 1, wherein the exhaust hole has a diameter of 1 mm to 3 mm.

* * * * *